United States Patent
Daimon et al.

(10) Patent No.: US 12,267,061 B2
(45) Date of Patent: Apr. 1, 2025

(54) SURFACE ACOUSTIC WAVE DEVICE

(71) Applicant: Murata Manufacturing Co., Ltd., Nagaokakyo (JP)

(72) Inventors: Naoki Daimon, Nagaokakyo (JP); Taku Kikuchi, Nagaokakyo (JP); Osamu Shimono, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 782 days.

(21) Appl. No.: 17/406,127

(22) Filed: Aug. 19, 2021

(65) Prior Publication Data

US 2021/0384885 A1 Dec. 9, 2021

Related U.S. Application Data

(63) Continuation of application No. PCT/JP2020/006228, filed on Feb. 18, 2020.

(30) Foreign Application Priority Data

Feb. 27, 2019 (JP) .................. 2019-034530

(51) Int. Cl.
*H03H 9/02* (2006.01)
*H03H 9/05* (2006.01)
*H03H 9/145* (2006.01)
*H03H 9/25* (2006.01)

(52) U.S. Cl.
CPC ........ *H03H 9/02543* (2013.01); *H03H 9/058* (2013.01); *H03H 9/145* (2013.01); *H03H 9/25* (2013.01)

(58) Field of Classification Search
CPC ............ H03H 9/02; H03H 9/05; H03H 9/145; H03H 9/25
See application file for complete search history.

(56) References Cited

U.S. PATENT DOCUMENTS

| | | | |
|---|---|---|---|
| 2008/0061657 A1 | 3/2008 | Matsuda et al. | |
| 2010/0277036 A1 | 11/2010 | Shimizu et al. | |
| 2018/0102761 A1 | 4/2018 | Takai et al. | |
| 2020/0119711 A1* | 4/2020 | Kadota | H03H 9/02551 |
| 2020/0220518 A1* | 7/2020 | Omura | H03H 9/132 |

FOREIGN PATENT DOCUMENTS

| | | | | |
|---|---|---|---|---|
| JP | 2002-151997 A | 5/2002 | | |
| JP | 2006-246050 A | 9/2006 | | |
| JP | 2008-067289 A | 3/2008 | | |
| KR | 20230136452 A | * | 9/2023 | ........... H03H 9/25 |
| WO | 2009/098840 A1 | 8/2009 | | |
| WO | 2017/013968 A1 | 1/2017 | | |
| WO | WO-2021125013 A1 | * | 6/2021 | ......... H03H 9/02559 |

OTHER PUBLICATIONS

Official Communication issued in International Patent Application No. PCT/JP2020/006228, mailed on Apr. 14, 2020.

* cited by examiner

*Primary Examiner* — J. San Martin
(74) *Attorney, Agent, or Firm* — Keating & Bennett, LLP

(57) ABSTRACT

A surface acoustic wave device includes a piezoelectric substrate including principal surfaces and an IDT electrode on a first principal surface side of the principal surfaces, and the first principal surface is a polarization positive potential surface of the piezoelectric substrate.

14 Claims, 8 Drawing Sheets

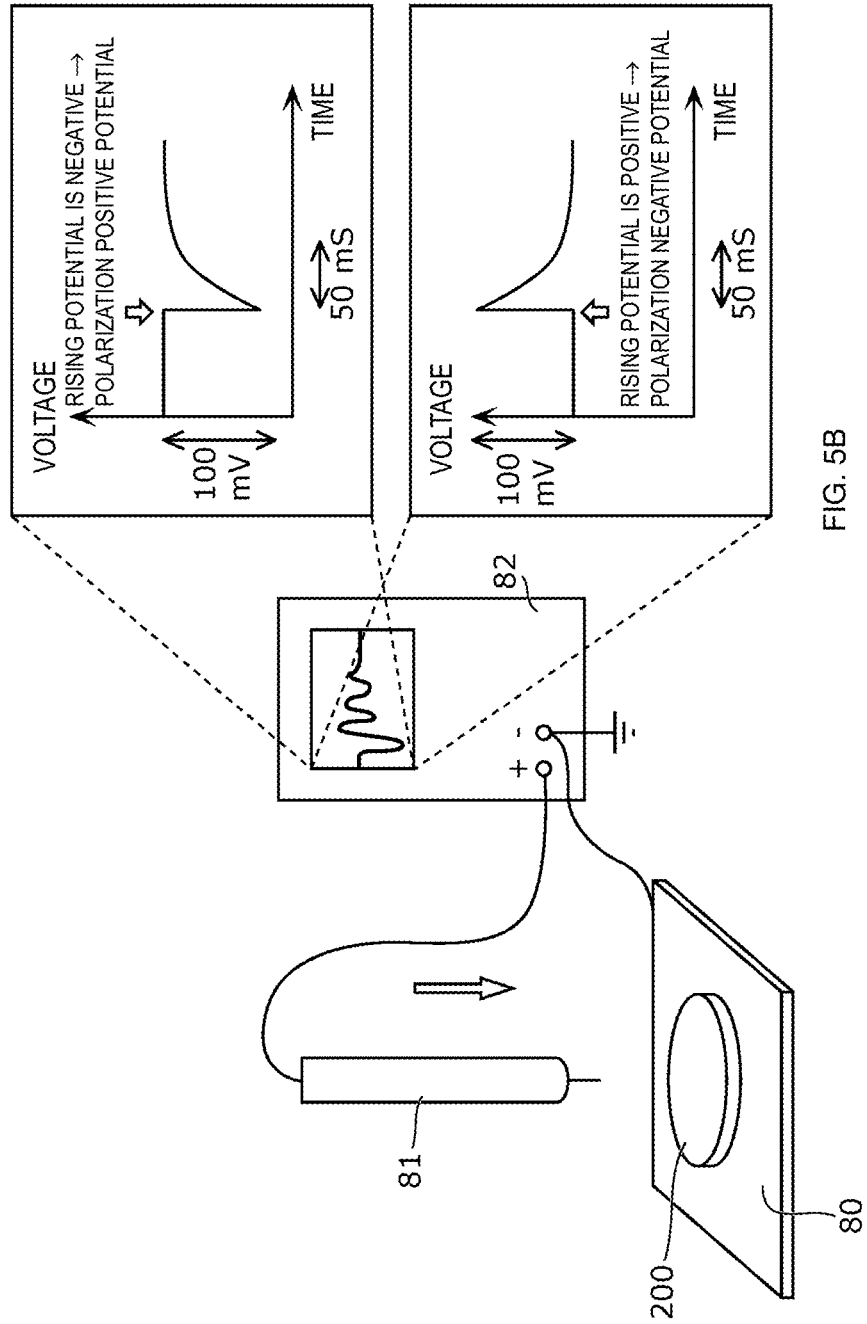

SURFACE ACOUSTIC WAVE DEVICE

CROSS REFERENCE TO RELATED APPLICATIONS

This application claims the benefit of priority to Japanese Patent Application No. 2019-034530 filed on Feb. 27, 2019 and is a Continuation Application of PCT Application No. PCT/JP2020/006228 filed on Feb. 18, 2020. The entire contents of each application are hereby incorporated herein by reference.

BACKGROUND OF THE INVENTION

1. Field of the Invention

The present invention relates to surface acoustic wave devices.

2. Description of the Related Art

In a surface acoustic wave device such as a surface acoustic wave (SAW) filter arranged at a front-end portion of a mobile communication machine, the electromechanical coupling coefficient may be effectively adjusted to support various pass band widths and steepness. To effectively adjust the electromechanical coupling coefficient, a dielectric film is arranged between a piezoelectric substrate and an interdigital transducer (IDT) electrode.

Japanese Unexamined Patent Application Publication No. 2002-151997 discloses an acoustic wave device in which a first dielectric film containing silicon oxide as a main component is formed between a piezoelectric substrate and an IDT electrode and a second dielectric film is formed so as to cover the IDT electrode. This allows the effective electromechanical coupling coefficient to be adjusted and also allows an acoustic wave device having excellent moisture resistance to be provided.

However, in the case of the acoustic wave device disclosed in Patent Japanese Unexamined Patent Application Publication No. 2002-151997, in a process of forming the IDT electrode, when the IDT electrode is formed by, for example, a vapor deposition method or the like, accumulation of negative charge on the first dielectric film or the IDT electrode increases due to the influence of reflection electrons. When this negative charge is accumulated on the surface of the piezoelectric substrate, problems arise, such as an occurrence of distortion of the crystal of the piezoelectric substrate to cause a crack in the piezoelectric substrate and degrade the characteristics of the acoustic wave device.

SUMMARY OF THE INVENTION

Preferred embodiments of the present invention provide surface acoustic wave devices in each of which an occurrence of a crack in the piezoelectric substrate and degradation in the characteristics of the acoustic wave device are reduced or prevented.

A surface acoustic wave device according to a preferred embodiment of the present invention includes a piezoelectric substrate including a first principal surface and a second principal surface opposed to each other and an interdigital transducer (IDT) electrode on a first principal surface side of the first principal surface and the second principal surface. The first principal surface is a polarization positive potential surface of the piezoelectric substrate.

According to preferred embodiments of the present invention, it is possible to provide surface acoustic wave devices in each of which an occurrence of a crack in the piezoelectric substrate and degradation in the characteristics of the acoustic wave device are reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A and 5B are structural diagrams of a system for measuring a polarization potential of a piezoelectric substrate.

DETAILED DESCRIPTION OF THE PREFERRED EMBODIMENTS

Figure 1A:
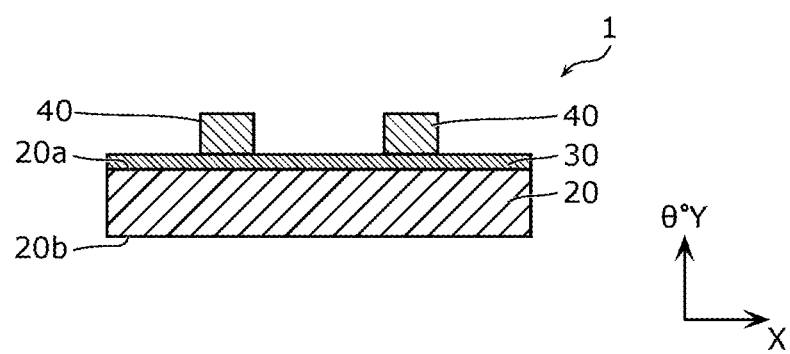
FIG. 1A is a schematic sectional view of a surface acoustic wave device according to a preferred embodiment of the present invention.

Preferred embodiments of the present invention are described below in detail with reference to the drawings. The preferred embodiments described below represent comprehensive or specific examples. Numerical values, shapes, materials, components, the arrangement of the components, topology, and so forth described in the preferred embodiments below are merely examples and are not intended to limit the present invention. Of the components in the preferred embodiments below, components not described in the independent claim are described as optional components. Also, the size of each component shown in the drawings or the ratio in size is not necessarily precise. Also, in each drawing, identical or substantially identical structures are provided with the same reference character and redundant description may be omitted or simplified.

Preferred Embodiment

1. Structure of Surface Acoustic Wave Device

FIG. 1A is a schematic sectional view of a surface acoustic wave device 1 according to a preferred embodiment of the present invention. As shown in the drawing, the surface acoustic wave device 1 includes a piezoelectric substrate 20, an interdigital transducer (IDT) electrode 40, and a dielectric film 30.

The piezoelectric substrate 20 includes a principal surface 20a (first principal surface) and a principal surface 20b (second principal surface) on an opposite side of the principal surface 20a from a substrate main body, and is made of, for example, a piezoelectric monocrystal of lithium tantalate ($LiTaO_3$), a piezoelectric monocrystal of lithium niobate ($LiNbO_3$), a piezoelectric monocrystal of potassium niobate ($KNbO_3$), or quartz. The principal surface 20a is a positive potential surface (polarization positive potential surface) in dielectric polarization of the piezoelectric substrate 20, and the principal surface 20b is a negative potential surface (polarization negative potential surface) in dielectric polarization of the piezoelectric substrate 20.

The IDT electrode 40 is made of, for example, a conductive metal, and includes a pair of comb-tooth-shaped electrodes opposed to each other when the piezoelectric substrate 20 is viewed in plan view. The detailed structure of the IDT electrode 40 will be described further below with reference to FIGS. 2A and 2B.

The dielectric film 30 is a first dielectric film provided between the piezoelectric substrate 20 and the IDT electrode 40 and in contact with the principal surface 20a of the principal surfaces 20a and 20b. The dielectric film 30 is made of at least one of, for example, silicon dioxide ($SiO_2$), silicon nitride ($Si_3N_4$), alumina ($Al_2O_3$), tantalum pentoxide ($Ta_2O_5$), and aluminum nitride (AlN). When the dielectric film 30 is interposed between the piezoelectric substrate 20 and the IDT electrode 40, the effective electromechanical coupling coefficient of the surface acoustic wave device 1 can be adjusted.

For example, as the thickness of the dielectric film 30 decreases, the effective electromechanical coupling coefficient of the surface acoustic wave device 1 is larger, and as the thickness of the dielectric film 30 increases, the effective electromechanical coupling coefficient of the surface acoustic wave device 1 is smaller.

Figure 1B:
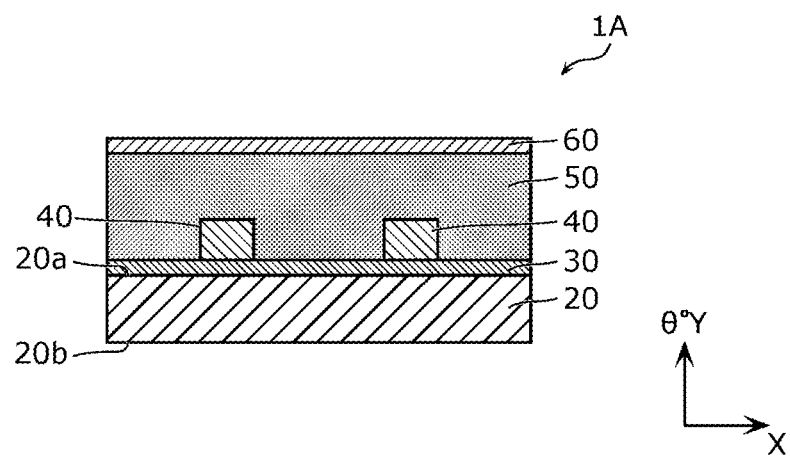
FIG. 1B is a schematic sectional view of a surface acoustic wave device according to a modification of a preferred embodiment of the present invention.

FIG. 1B is a schematic sectional view of a surface acoustic wave device 1A according to a modification of a preferred embodiment of the present invention. As shown in FIG. 1B, the surface acoustic wave device 1A includes the piezoelectric substrate 20, the IDT electrode 40, and dielectric films 30, 50, and 60. The surface acoustic wave device 1A according to the present modification is different, compared with the surface acoustic wave device 1 according to the present preferred embodiment, in that the dielectric films 50 and 60 are included.

The dielectric films 50 and 60 are second dielectric films which cover the IDT electrode 40. The dielectric film 50 mainly protects the IDT electrode 40 from the external environment (such as moisture) and improves the frequency-temperature characteristics of the surface acoustic wave device 1A. Also, the dielectric film 60 mainly protects the IDT electrode 40 from the external environment (such as moisture) and adjusts the frequency of the surface acoustic wave device 1A.

Also, in the surface acoustic wave device 1 according to the present preferred embodiment and the surface acoustic wave device 1A according to the present modification, the dielectric film 30 may be omitted.

The surface acoustic wave device 1 according to the present preferred embodiment and the surface acoustic wave device 1A according to the present modification each have the above-described structure to define a surface acoustic wave resonator. The structure and operation of the surface acoustic wave resonator of the surface acoustic wave devices 1 and 1A are described below in detail.

2. Structure of Surface Acoustic Wave Resonator

Figures 2A, 2B:
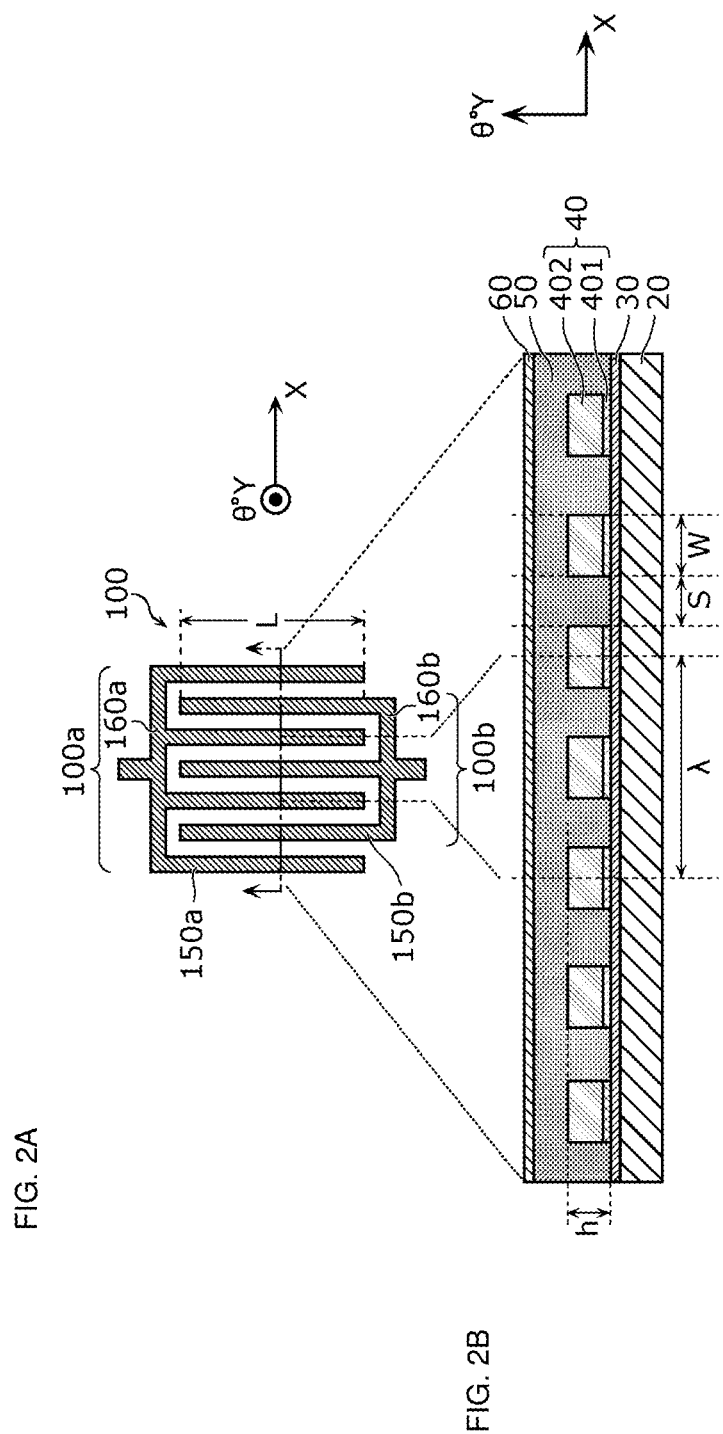
FIGS. 2A and 2B are a plan view and a sectional view representing the electrode structure of a surface acoustic wave device according to a modification of a preferred embodiment of the present invention.

FIGS. 2A and 2B are a plan view and a sectional view representing the electrode structure of the surface acoustic wave device 1A according to a modification of the above-described preferred embodiment. FIG. 2B is a sectional view along a one-dot-chain line in FIG. 2A. In FIGS. 2A and 2B, a schematic plan view and a schematic sectional view representing the structure of one surface acoustic wave resonator 100 among one or more surface acoustic wave resonators of the surface acoustic wave device 1A are exemplified. The surface acoustic wave resonator 100 in FIGS. 2A and 2B is to describe a typical structure of the above-described one or more surface acoustic wave resonators and the number and length of electrode fingers configuring an electrode are not limited to this.

The surface acoustic wave resonator 100 includes the piezoelectric substrate 20 and comb-tooth-shaped electrodes 100a and 100b.

As shown in FIG. 2A, on the piezoelectric substrate 20, the paired comb-tooth-shaped electrodes 100a and 100b are opposed to each other. The comb-tooth-shaped electrode 100a includes a plurality of electrode fingers 150a parallel or substantially parallel to one another and busbar electrodes 160a connecting the plurality of electrode fingers 150a. Also, the comb-tooth-shaped electrode 100b includes a plurality of electrode fingers 150b parallel or substantially parallel to one another and busbar electrodes 160b connecting the plurality of electrode fingers 150b. The plurality of electrode fingers 150a and 150b extend along a direction orthogonal or substantially orthogonal to an acoustic-wave propagation direction (X-axis direction).

Also, the IDT electrode 40 including the paired electrode fingers 150a and 150b and the busbar electrodes 160a and 160b have, for example, as shown in FIG. 2B, a multilayer structure of an adhesion layer 401 and a principal electrode layer 402.

The adhesion layer 401 improves adhesiveness between the piezoelectric substrate 20 and the principal electrode layer 402, and as a material of the adhesion layer 401, for example, Ti, NiCr, or the like is used.

As a material of the principal electrode layer 402, for example, AlCu, Au, Cu, or Pt is used.

Note that the material of the adhesion layer 401 and the principal electrode layer 402 is not limited to the above-described materials. Furthermore, the IDT electrode 40 may not have the multilayer structure. The IDT electrode 40 may be made of, for example, a metal such as Ti, Al, Cu, Pt, Au, Ag, Pd, Mo, and W or an alloy thereof, or may include a plurality of multilayer bodies made of the above-described metal or alloy. Note that the metal material of the IDT electrode 40 preferably has a density higher than that of the dielectric material of the dielectric film 30 to enable the reflection coefficient of the surface acoustic wave to increase.

The piezoelectric substrate 20 is made of, for example, a θ° rotated Y cut X SAW propagation $LiTaO_3$ piezoelectric monocrystal or piezoelectric ceramics (lithium tantalate monocrystal or ceramics cut along a surface with its normal line being an axis rotated by θ° from the Y axis by taking the X axis as the center axis, where a surface acoustic wave propagates to the X-axis direction), as shown in FIGS. 2A and 2B. Note that the material and the cut-angle of the piezoelectric substrate 20 are selected as appropriate depending on the requirement specification of the surface acoustic wave device 1A.

Note that the piezoelectric substrate 20 may include a high-acoustic-velocity support substrate, a low-acoustic-velocity film, and a piezoelectric film, in which the high-acoustic-velocity support substrate, the low-acoustic-velocity film, and the piezoelectric film are stacked in this sequence. The high-acoustic-velocity support substrate supports the low-acoustic-velocity film, the piezoelectric film, and the IDT electrode 40. Further, the high-acoustic-velocity support substrate is a substrate in which the acoustic velocity of a bulk wave in the high-acoustic-velocity support substrate is higher than that of acoustic waves such as a surface acoustic wave and a boundary wave propagating through the piezoelectric film, and traps the surface acoustic wave in a portion where the piezoelectric film and the low-acoustic-velocity film are stacked to prevent leakage below the high-acoustic-velocity support substrate. The high-acoustic-velocity support substrate is, for example, a silicon substrate. The low-acoustic-velocity film is a film in which the acoustic velocity of a bulk wave in the low-acoustic-velocity film is lower than that of a bulk wave propagating through the piezoelectric film, and is arranged between the piezoelectric film and the high-acoustic-velocity support substrate. This structure and the property of energy concentration on a medium in which the acoustic wave is intrinsically at low acoustic velocity reduce or prevent leakage of surface acoustic wave energy to the outside of the IDT electrode 40. The low-acoustic-velocity film is, for example, a film including silicon dioxide as a main component. By making the piezoelectric substrate 20 to have this multilayer structure, the Q value in resonant frequency and anti-resonant frequency can be increased. That is, a surface acoustic wave resonator with a high Q value can be provided. Thus, by using the surface acoustic wave resonator, a filter with small insertion loss can be provided.

Note that the high-acoustic-velocity support substrate may have a structure in which a support substrate and a high-acoustic-velocity film are stacked, and in the high-acoustic-velocity film, the acoustic velocity of a propagating bulk wave is higher than that of acoustic waves such as a surface acoustic wave and a boundary wave propagating through the piezoelectric film. In this case, for the support substrate, it is possible to use a piezoelectric material such as, for example, sapphire, lithium tantalate, lithium niobate, or quartz; any of various ceramics such as alumina, magnesia, silicon nitride, aluminum nitride, silicon carbide, zirconia, cordierite, mullite, steatite, and forsterite; a dielectric such as glass; a semiconductor and resin substrate such as silicon and gallium nitride; or the like. Also, for the high-acoustic-velocity film, it is possible to use any of various high-acoustic-velocity materials such as, for example, aluminum nitride, aluminum oxide, silicon carbide, silicon nitride, silicon oxynitride, a DLC film, diamond, a medium containing any of the above-described materials as a main component, a medium containing a mixture of the above-described materials as a main component, and the like.

Here, one example of electrode parameters of the IDT electrode of the surface acoustic wave resonator is described.

The wavelength of the surface acoustic wave resonator is defined by a wavelength λ, which is a repetition period of the plurality of electrode fingers 150a or 150b of the IDT electrode 40 shown in FIGS. 2A and 2B. Also, the electrode pitch is ½ of the wavelength λ, and is defined as (W+S), where the line width of the electrode fingers 150a and 150b of the comb-tooth-shaped electrodes 100a and 100b is denoted as W and the space width between the electrode finger 150a and the electrode finger 150b adjacent to each other is denoted as S. Also, an intersecting width L of the paired comb-tooth-shaped electrodes 100a and 100b is, as shown in FIG. 2A, the length of overlapping electrode fingers when viewed from the acoustic-wave propagation direction (X-axis direction) of the electrode finger 150a and the electrode finger 150b. Also, the electrode duty of each surface acoustic wave resonator is a line width occupation ratio of the plurality of electrode fingers 150a and 150b, and is defined as W/(W+S). Furthermore, the height of the comb-tooth-shaped electrodes 100a and 100b is set at h.

Note that while the electrode structure of the surface acoustic wave device 1A according to the present modification is shown in FIGS. 2A and 2B, the electrode structure of the surface acoustic wave device 1 according to the present preferred embodiment is similar to an electrode structure in which the dielectric films 50 and 60 are not provided in FIGS. 2A and 2B.

In the surface acoustic wave device with the above-described structure, when a high-frequency signal is applied between the comb-tooth-shaped electrodes 100a and 100b, a potential difference occurs between the comb-tooth-shaped electrodes 100a and 100b, and this causes the principal surface 20a of the piezoelectric substrate 20 to be distorted to generate a surface acoustic wave propagating to the X direction. Here, by adjusting the wavelength λ of the IDT electrode 40 in accordance with the pass band, only a high-frequency signal having frequency components that are desired to pass passes through the surface acoustic wave device.

3. Electrode Structure and Manufacturing Method of Surface Acoustic Wave Device

Figure 3:
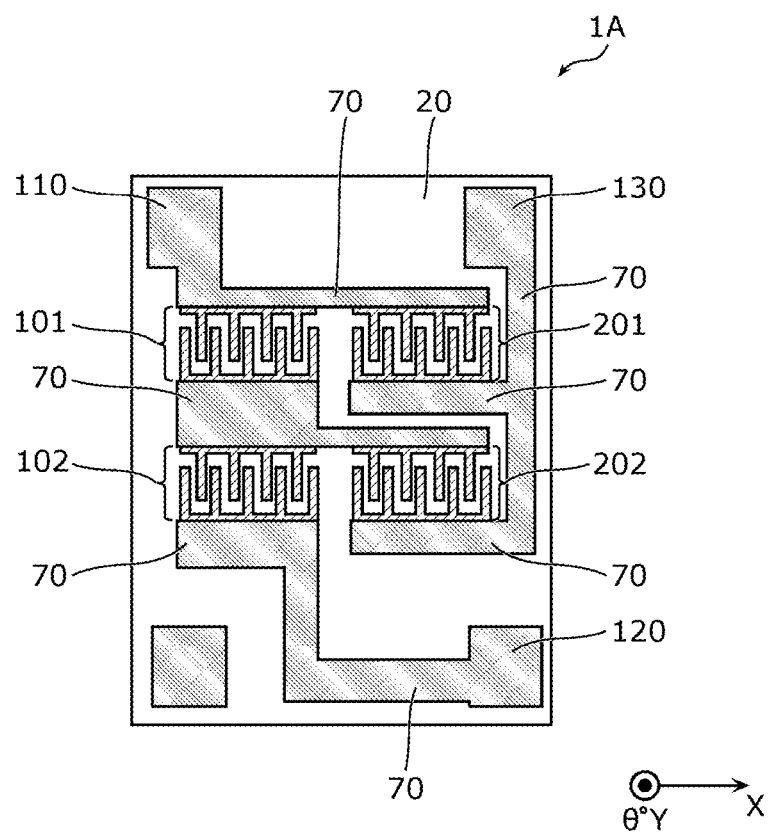
FIG. 3 is a plan view of one example of an electrode layout of a surface acoustic wave device according to a preferred embodiment of the present invention.

FIG. 3 is a plan view of one example of the electrode layout of the surface acoustic wave device 1A according to the present preferred embodiment. The surface acoustic wave device 1A is a ladder surface acoustic wave filter including, for example, two series arm resonators and two parallel arm resonators. As shown in FIG. 3, in the surface acoustic wave device 1A in the present example, IDT electrodes 101, 102, 201, and 202, a connection electrode 70, input/output electrodes 110 and 120, and a ground electrode 130 are provided on the dielectric film 30 (not shown) on the piezoelectric substrate 20. Also, although not shown, the dielectric films 50 and 60 are provided on the IDT electrodes 101, 102, 201, and 202.

Of the two series arm resonators, one series arm resonator is a surface acoustic wave resonator including the IDT electrode 101 and the piezoelectric substrate 20, and the other series arm resonator is a surface acoustic wave resonator including the IDT electrode 102 and the piezoelectric substrate 20. The IDT electrodes 101 and 102 are in series on a route connecting the input/output electrodes 110 and 120.

Of the two parallel arm resonators, one parallel arm resonator is a surface acoustic wave resonator including the IDT electrode 201 and the piezoelectric substrate 20, and the other parallel arm resonator is a surface acoustic wave resonator including the IDT electrode 202 and the piezoelectric substrate 20. The IDT electrode 201 is between a connection node between the input/output electrode 110 and the IDT electrode 101 and the ground electrode 130. The IDT electrode 202 is between a connection node between the IDT electrode 101 and the IDT electrode 102 and the ground electrode 130.

Extending directions of the plurality of electrode fingers of the respective IDT electrodes 101, 102, 201, and 202 are aligned, and a direction orthogonal or substantially orthogonal to the extending directions of the plurality of electrode fingers is a propagation direction of the surface acoustic wave.

The connection electrode 70 is a wire connecting the IDT electrodes 101, 102, 201, and 202, the input/output electrodes 110 and 120, and the ground electrode 130. In particular, the connection electrode 70 is connected to busbar electrodes of the IDT electrodes 101, 102, 201, and 202.

Here, a non-limiting example of a process of manufacturing the surface acoustic wave device 1A with the above-described electrode layout is described.

FIGS. 4A to 4G are process flowcharts showing one example of the method of manufacturing the surface acoustic wave device 1A according to the modification of the present preferred embodiment.

Figure 4A:
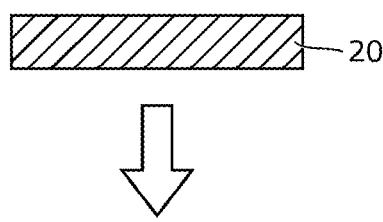
FIGS. 4A to 4G are process flowcharts of one example of a method of manufacturing a surface acoustic wave device according to a modification of a preferred embodiment of the present invention.

First, as shown in FIG. 4A, the piezoelectric substrate 20 is prepared. The material of the piezoelectric substrate 20 is, for example, a piezoelectric monocrystal of lithium niobate ($LiNbO_3$). When the piezoelectric substrate 20 is prepared, it is determined which principal surface of the two principal surfaces of a piezoelectric wafer as a collective body of the piezoelectric substrates 20 is a polarization positive potential surface. The polarization positive potential surface of the piezoelectric wafer is determined by, for example, a measurement system shown in FIGS. 5A and 5B.

FIGS. 5A and 5B are structural diagrams of the system for measuring a polarization potential of a piezoelectric wafer 200 (piezoelectric substrates 20). As shown in FIGS. 5A and 5B, the system for measuring a polarization potential of the piezoelectric wafer 200 (piezoelectric substrates 20) includes a metal plate 80, a measuring probe 81, and an oscilloscope 82. In the above-described system, the piezoelectric wafer 200 whose polarization potential is to be measured is disposed on and in contact with the metal plate 80 connected to the ground terminal of the oscilloscope 82. In this state, potential changes of the measuring probe 81 when the principal surface of the piezoelectric wafer 200 not in contact with the metal plate 80 is tapped with the tip of the measuring probe 81 are observed. From a rising waveform of the potential when the measuring probe 81 makes contact with the principal surface, the polarization potential of the principal surface can be determined. For example, when the rising potential with the measuring probe 81 in contact with the principal surface is negative, it is determined that the principal surface is at a polarization positive potential (FIG. 5A). When the rising potential with the measuring probe 81 in contact with the principal surface is positive, it is determined that the principal surface is at a polarization negative potential (FIG. 5B).

Figure 4B:
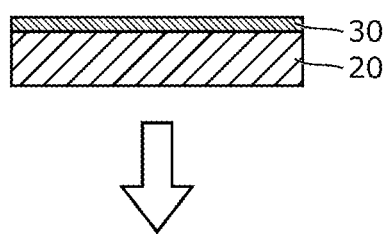

Next, as shown in FIG. 4B, the dielectric film 30 is formed on the first principal surface of the piezoelectric substrate 20 corresponding to the polarization positive potential surface of the two principal surfaces of the piezoelectric wafer. More specifically, for example, the dielectric film 30 made of $SiO_2$ is formed by sputtering.

Figure 4C:
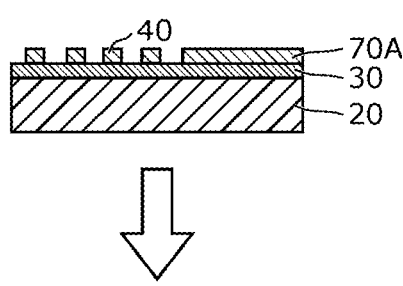

Next, as shown in FIG. 4C, the IDT electrode 40 and a lower-layer connection electrode 70A are formed on the dielectric film 30. More specifically, the IDT electrode 40 and the lower-layer connection electrode 70A are formed by, for example, forming a resist on the dielectric film 30, patterning the resist, forming a multilayer body of NiCr/Pt/Ti/AlCu by vapor deposition, and patterning the multilayer body by the lift-off method.

Figure 4D:
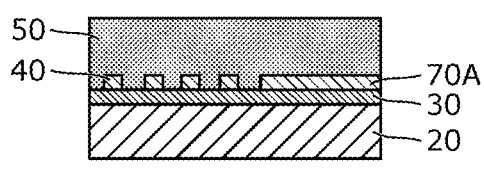

Next, as shown in FIG. 4D, the dielectric film 50 is formed on the dielectric film 30, the IDT electrode 40, and the lower-layer connection electrode 70A. More specifically, the dielectric film 50 is formed by, for example, forming a dielectric film made of $SiO_2$ by sputtering.

Figure 4E:
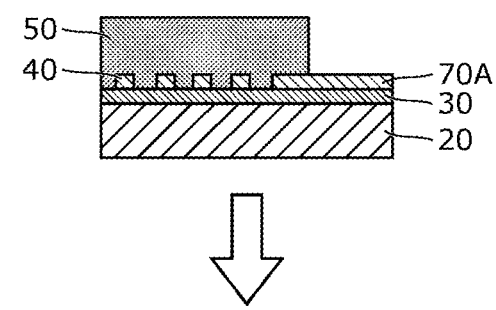

Next, as shown in FIG. 4E, a cavity where the dielectric film 50 is not formed is formed on the surface of the lower-layer connection electrode 70A. More specifically, the cavity where the dielectric film 50 is not formed is formed by, for example, forming a resist on the dielectric film 50, forming a resist cavity above the lower-layer connection electrode 70A, and etching with the dielectric film 50 of the resist cavity by reactive ion etching. The remaining resist is peeled off.

Figure 4F:
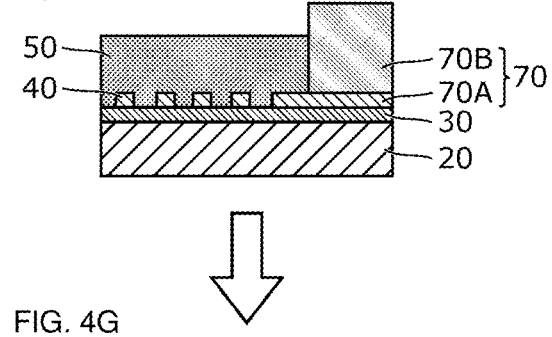

Next, as shown in FIG. 4F, an upper-layer connection electrode 70B is formed above the lower-layer connection electrode 70A. More specifically, the upper-layer connection electrode 70B is formed above the lower-layer connection electrode 70A by, for example, forming a resist on the dielectric film 50 and the lower-layer connection electrode 70A, patterning the resist, forming a multilayer body of Ti/AlCu by vapor deposition, and patterning the multilayer body by the lift-off method.

This makes the connection electrode 70, which is a multilayer body of the lower-layer connection electrode 70A and the upper-layer connection electrode 70B, become a low-resistance wire having a film thickness larger than that of the IDT electrode 40. Thus, propagation loss of the surface acoustic wave device 1A can be reduced.

Figure 4G:
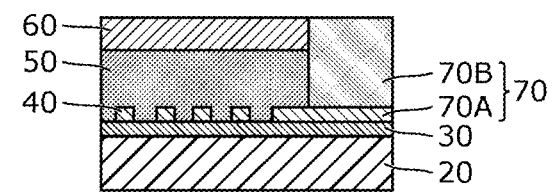

Finally, as shown in FIG. 4G, the dielectric film 60 is formed on the dielectric film 50. More specifically, the dielectric film 60 is formed on the dielectric film 50 by, for example, forming a dielectric film made of $Si_3N_4$ by sputtering, forming a resist, and performing reactive ion etching.

Note that although not shown in FIGS. 4A to 4G, at the time of ending the process in FIG. 4G, a collective body of surface acoustic wave devices is formed on the piezoelectric wafer and by separating the collective body into pieces by dicing or the like, individual surface acoustic wave devices are formed.

4. Dielectric Film of Surface Acoustic Wave Device

As described above, when the dielectric film 30 is provided between the piezoelectric substrate 20 and the IDT electrode 40, the effective electromechanical coupling coefficient of the surface acoustic wave devices 1 and 1A can be adjusted.

On the other hand, when the dielectric film 30 is formed, negative charge generated during the process of forming the IDT electrode 40, the connection electrode 70, and so forth tends to be accumulated on the principal surface 20a of the piezoelectric substrate 20.

Figure 6:
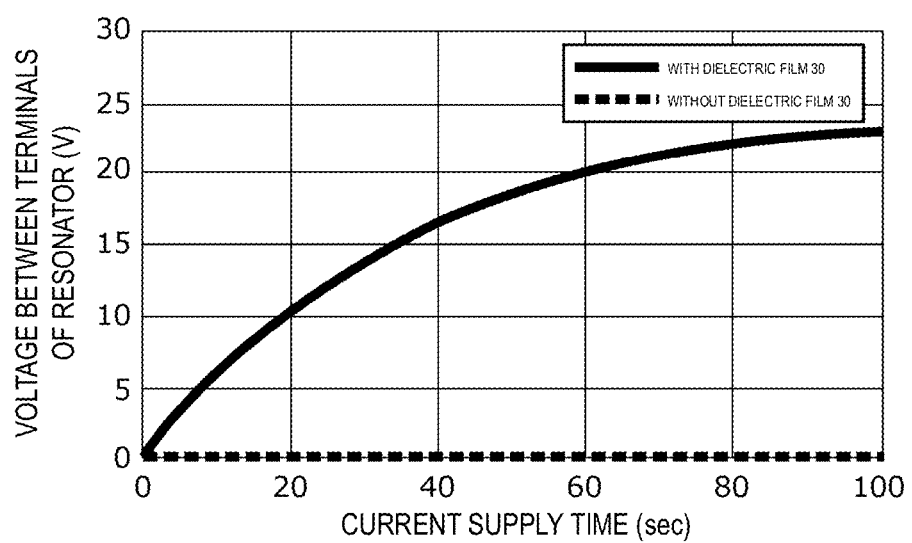
FIG. 6 is a graph comparing voltage between terminals of resonators, depending on the presence or absence of a dielectric film.

FIG. 6 is a graph comparing voltage between terminals of surface acoustic wave resonators, depending on the presence or absence of the dielectric film 30. In FIG. 6, there are shown changes with time in voltage between the input/output terminals of a surface acoustic wave resonator with the dielectric film 30 provided between the piezoelectric substrate 20 and the IDT electrode 40 (in FIG. 6, with dielectric film 30) and a surface acoustic wave resonator with the dielectric film 30 not arranged between the piezoelectric substrate 20 and the IDT electrode 40 (in FIG. 6, without dielectric film 30). More specifically, in FIG. 6, there is shown dependency of current supply time of voltage between the input/output terminals generated when charge is supplied from a current source to the IDT electrode of each of the two surface acoustic wave resonators.

As shown in FIG. 6, negative charge tends to be accumulated when the dielectric film 30 is provided between the piezoelectric substrate 20 and the IDT electrode 40. That is, in the surface acoustic wave device where the dielectric film 30 is provided to adjust the effective electromechanical coupling coefficient, negative charge tends to be accumulated on the principal surface of the piezoelectric substrate to a greater extent. Thus, in the surface acoustic wave device where the dielectric film 30 is provided, it is very important to take a structure in which polarization reversal of the piezoelectric substrate tends to occur less.

By contrast, as in the surface acoustic wave device 1 according to the present preferred embodiment and the surface acoustic wave device 1A according to the present modification, the principal surface 20a of the piezoelectric substrate 20 where the dielectric film 30, the IDT electrode 40, and the connection electrode 70 are provided is set as a polarization positive potential surface. According to this, the occurrence of polarization reversal can be reduced or prevented even if negative charge is accumulated on the principal surface 20a during the process of forming the dielectric film 30, the IDT electrode 40, the connection electrode 70, and so forth.

5. Summary

The surface acoustic wave device 1 according to the present preferred embodiment includes the piezoelectric substrate 20 including the principal surface 20a and the principal surface 20b and the IDT electrode 40 on the principal surface 20a side of the principal surface 20a and the principal surface 20b. The principal surface 20a is a polarization positive potential surface of the piezoelectric substrate 20.

It is assumed that electrons generated during formation of the IDT electrode 40 are accumulated on the IDT electrode 40 and the accumulated negative charge and the negative charge on the principal surface 20a become repulsive to each other to generate a region where the polarization axis of the piezoelectric substrate is reversed. This generation of the region where the polarization axis is reversed causes distortion of the crystal on the principal surface 20a to cause a crack in the piezoelectric substrate 20 and degrade the characteristics of the surface acoustic wave device. By contrast, according to the above-described structure, by forming the IDT electrode 40 on a polarization positive potential surface side of the piezoelectric substrate 20, reversal of the polarization axis of the piezoelectric substrate 20 during formation of the IDT electrode 40 can be reduced or prevented. Thus, it is possible to reduce or prevent breakage of an element due to the occurrence of a crack in the piezoelectric substrate 20 due to distortion in crystal of the piezoelectric substrate 20 and degradation of the characteristics of the surface acoustic wave device 1.

Also, the surface acoustic wave device 1 may further include the dielectric film 30 between the piezoelectric substrate and the IDT electrode 40 and in contact with the principal surface 20a.

According to this, when the dielectric film 30 is provided between the piezoelectric substrate 20 and the IDT electrode 40, the effective electromechanical coupling coefficient of the surface acoustic wave device 1 can be adjusted at a desired magnitude. However, if the dielectric film 30 is provided on the polarization negative potential surface of the piezoelectric substrate 20, electrons generated during the formation of the dielectric film 30 and the IDT electrode 40 are accumulated on the IDT electrode 40, and the accumulated negative charge and the negative charge on the principal surface 20a become repulsive to each other to generate a region where the polarization axis of the piezoelectric substrate 20 is reversed. This generation of the region where the polarization axis is reversed causes distortion of the crystal on the principal surface 20a to cause a crack in the piezoelectric substrate 20 and degrade the characteristics of the surface acoustic wave device 1.

In contrast, according to the above-described structure, by forming the dielectric film 30 and the IDT electrode 40 on the polarization positive potential surface side of the piezoelectric substrate 20, reversal of the polarization axis of the piezoelectric substrate 20 during formation of the dielectric film 30 and the IDT electrode 40 can be reduced or prevented. Thus, while the effective electromechanical coupling coefficient is adjusted to a desired magnitude, it is possible to reduce or prevent breakage of an element due to the occurrence of a crack in the piezoelectric substrate 20 due to distortion in crystal of the piezoelectric substrate 20 and degradation of the characteristics of the surface acoustic wave device 1.

Also, the principal surface 20b is a polarization negative potential surface of the piezoelectric substrate 20. According to this, since the principal surface 20a of the piezoelectric substrate is a polarization positive potential surface, if electrons generated when the dielectric film 30 and the IDT electrode 40 are provided flow in, the polarization axis on the principal surface 20a is not reversed.

Also, the surface acoustic wave device 1A according to the present modification further includes the dielectric film 50 which covers the IDT electrode 40. According to this, it is possible to adjust the frequency-temperature characteristics of the surface acoustic wave device 1A and protect the IDT electrode 40 from the external environment.

6. Comparison in Characteristics by Polarization Potential of Piezoelectric Substrate Next, the characteristics of a surface acoustic wave device according to a practical example of a preferred embodiment of the present invention are compared with those of a surface acoustic wave device according to a comparative example. The surface acoustic wave device according to the practical example has a configuration in which the dielectric films 30, 50, and 60, the IDT electrode 40, and the connection electrode 70 are provided on the polarization positive potential surface of the piezoelectric substrate 20. On the other hand, the surface acoustic wave device according to the comparative example has a configuration in which the dielectric films 30, 50, and 60, the IDT electrode 40, and the connection electrode 70 are provided on the polarization negative potential surface of the piezoelectric substrate 20.

Structure parameters of the surface acoustic wave devices according to the practical example and the comparative example are presented in Table 1.

TABLE 1

|  | Practical example | Comparative example |
|---|---|---|
| Principal surface 20a of piezoelectric wafer (piezoelectric substrate 20) | Polarization positive potential surface | Polarization negative potential surface |

TABLE 1-continued

| | Practical example | Comparative example |
|---|---|---|
| (IDT electrode 40 formation surface) Piezoelectric substrate 20 Euler angles (0, θ, 0) | (0, −94, 0) | (0, 86, 0) |
| IDT electrode 40 multilayer structure (and lower-layer connection electrode 70A) | NiCr/Pt/Ti/AlCu | NiCr/Pt/Ti/AlCu |
| Upper-layer connection electrode 70B multilayer structure | Ti/AlCu | Ti/AlCu |
| Dielectric film 30 film thickness | about 24 nm | about 24 nm |
| Dielectric film 50 film thickness | about 1400 nm | about 1400 nm |

Note that in both of the practical example and the comparative example, the piezoelectric wafer was a piezoelectric single-crystal wafer of lithium niobate (LiNbO$_3$) with a length of about four inches.

Prototypes of four collective bodies (piezoelectric wafer state) of surface acoustic wave devices according to the comparative example were experimentally produced, and prototypes of eight collective bodies (piezoelectric wafer state) of surface acoustic wave devices according to the practical example were experimentally produced. In all of the four collective bodies of surface acoustic wave devices according to the comparative example, the occurrence of cracks was confirmed in a portion of the piezoelectric wafer surfaces. On the other hand, in all of the eight collective bodies of surface acoustic wave devices according to the practical example, no occurrence of cracks in the piezoelectric wafers was confirmed.

Figures 7A, 7B:
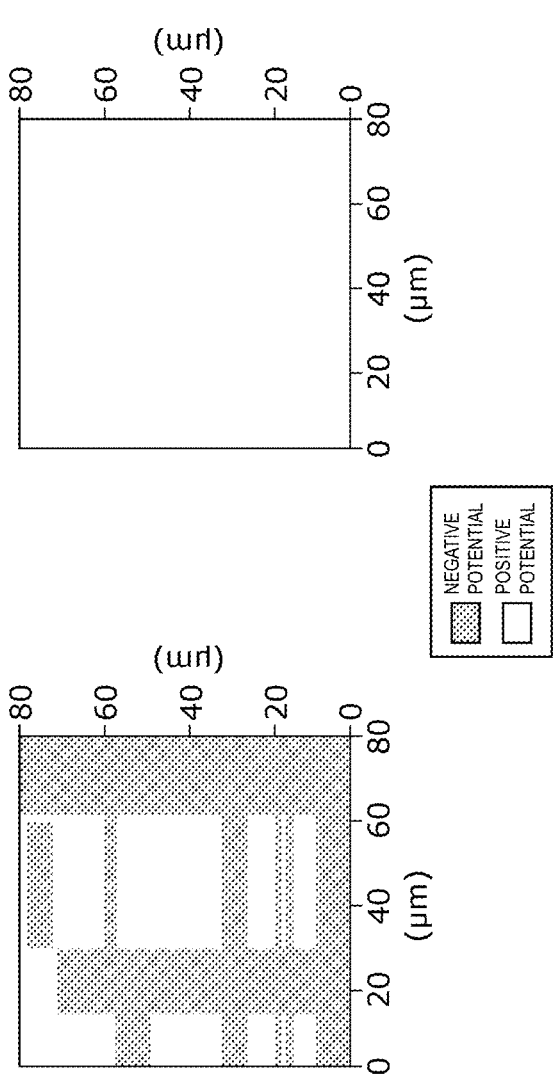
FIGS. 7A and 7B are diagrams comparing polarization potential distribution on the surface of the piezoelectric substrate between surface acoustic wave devices according to a practical example of a preferred embodiment of the present invention and a comparative example.

FIGS. 7A and 7B are diagrams comparing polarization potential distribution on the principal surface 20a of the piezoelectric substrate 20 between the surface acoustic wave devices according to the practical example and the comparative example. In FIG. 7A, there is shown a potential distribution on the principal surface 20a of the piezoelectric substrate 20 of the surface acoustic wave device according to the comparative example, specifically, the potential distribution on the principal surface 20a after the IDT electrode 40 is formed on the principal surface 20a as a polarization negative potential surface and then the IDT electrode 40 is peeled off. Also, in FIG. 7B, there is shown a potential distribution on the principal surface 20a of the piezoelectric substrate 20 of the surface acoustic wave device according to the practical example, specifically, the potential distribution on the principal surface 20a after the IDT electrode 40 is formed on the principal surface 20a as a polarization positive potential surface and then the IDT electrode 40 is peeled off. Note that the potential distributions of FIGS. 7A and 7B were measured by a piezo response microscope (PRM) mode of a scanning-type probe microscope.

As shown in FIG. 7A, in the surface acoustic wave device according to the comparative example, a negative potential area and a reversed area reversed to the positive potential are mixedly distributed on the principal surface 20a. In particular, a boundary between the negative potential area and the positive potential area corresponds to a boundary between a non-formation area and a formation area of the IDT electrode 40.

In contrast, in the surface acoustic wave device according to the practical example, only the positive potential area has been confirmed on the principal surface 20a, and no area reversed to the negative potential is found. The reason for this is inferred that in the process of forming the dielectric film 30 and the IDT electrode 40, even if electrons flow into the dielectric film 30 and the IDT electrode 40 and are accumulated, the principal surface 20a where the dielectric film 30 and the IDT electrode 40 are formed is at a positive potential and therefore the accumulated negative charge and the positive charge on the principal surface 20a attract each other to prevent the occurrence of polarization reversal of the principal surface 20a.

According to the surface acoustic wave device of the practical example, when the principal surface 20a of the piezoelectric substrate 20 where the IDT electrode 40 is formed is set as a polarization positive potential surface, polarization reversal of the piezoelectric substrate 20 and the occurrence of cracks accordingly in the manufacturing process can be reduced or prevented, and production stability can be improved.

Figure 8:
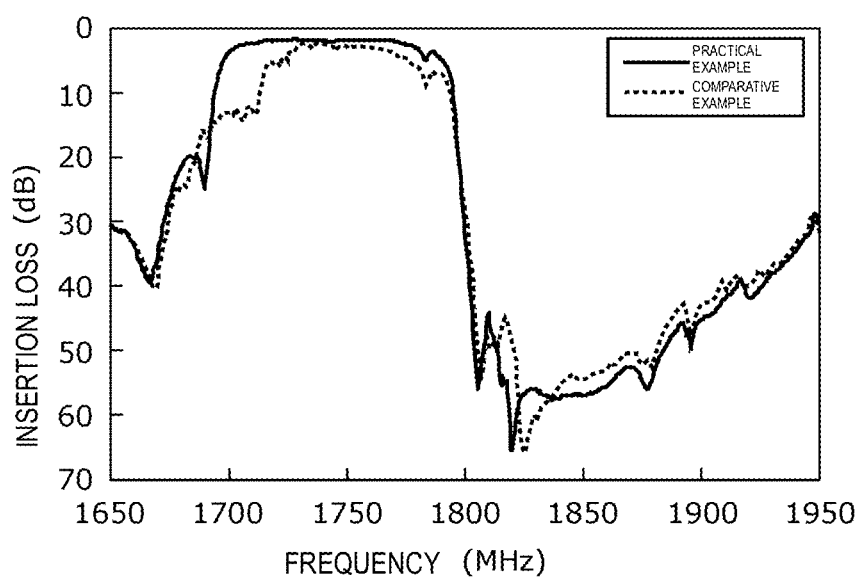
FIG. 8 is a graph for comparison in bandpass characteristics between the surface acoustic wave devices according to the practical example and the comparative example.

FIG. 8 is a graph comparing bandpass characteristics between the surface acoustic wave devices according to the practical example and the comparative example. As shown in FIG. 8, in filter bandpass characteristics with a pass band of about 1710 MHz to about 1785 MHz, insertion loss in the pass band of the surface acoustic wave device according to the comparative example is degraded compared with insertion loss in the pass band of the surface acoustic wave device according to the practical example.

That is, according to the surface acoustic wave device of the practical example, polarization reversal of the piezoelectric substrate 20 and the occurrence of cracks accordingly in the manufacturing process are reduced or prevented, and thus degradation in characteristics such as bandpass characteristics of the surface acoustic wave device can be reduced or prevented.

OTHER PREFERRED EMBODIMENTS

Surface acoustic wave devices according to the present invention have been described above with reference to preferred embodiments of the present invention and modifications thereof. However, the present invention is not limited to the above-described preferred embodiments and modifications. The present invention also includes other preferred embodiments provided by combining any components in the above-described preferred embodiments and modifications and modifications obtained by subjecting the above-described preferred embodiments and modifications to various modifications derived by a person skilled in the art without deviating from the gist of the present invention.

Also, in the surface acoustic wave devices according to the above-described preferred embodiments and modifications, a ladder surface acoustic wave filter is exemplarily described. However, surface acoustic wave devices according to preferred embodiments of the present invention may be longitudinally-coupled surface acoustic wave filters or the like, for example, and may be resonators including surface acoustic wave resonators, for example. That is, surface acoustic wave devices according to preferred embodiments of the present invention are any acoustic wave devices each including a surface acoustic wave resonator including a piezoelectric substrate and an IDT electrode.

Preferred embodiments of the present invention can be widely used for communication equipment such as, for example, mobile phones as a surface acoustic wave filter with low loss and excellent production stability.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
a piezoelectric substrate including a first principal surface and a second principal surface opposed to each other;
an interdigital transducer (IDT) electrode on a first principal surface side of the first principal surface and the second principal surface; and
a first dielectric film between the piezoelectric substrate and the IDT electrode and in contact with the first principal surface; wherein
the first principal surface is a polarization positive potential surface of the piezoelectric substrate.

2. The surface acoustic wave device according to claim 1, wherein the first dielectric film is made of at least one of $SiO_2$, $Si_3N_4$, $Al_2O_3$, $Ta_2O_5$, and AlN.

3. The surface acoustic wave device according to claim 1, wherein the piezoelectric substrate is made of $LiTaO_3$ or $LiNbO_3$.

4. The surface acoustic wave device according to claim 1, further comprising a second dielectric film covering the IDT electrode.

5. The surface acoustic wave device according to claim 1, wherein the piezoelectric substrate is made of a piezoelectric monocrystal of $LiTaO_3$, a piezoelectric monocrystal of $LiNbO_3$, a piezoelectric monocrystal of $KNbO_3$, or quartz.

6. The surface acoustic wave device according to claim 1, wherein the piezoelectric substrate includes a high-acoustic-velocity support substrate, a low-acoustic-velocity film, and a piezoelectric film stacked in this sequence.

7. The surface acoustic wave device according to claim 6, wherein the high-acoustic-velocity support substrate includes a support substrate and a high-acoustic-velocity film on the support substrate, and an acoustic velocity of a bulk wave propagating in the high-acoustic-velocity support substrate is higher than an acoustic velocity of acoustic waves propagating through the piezoelectric film.

8. The surface acoustic wave device according to claim 6, wherein the high-acoustic-velocity support substrate is a silicon substrate.

9. The surface acoustic wave device according to claim 6, wherein the low-acoustic-velocity film includes $SiO_2$ as a main component.

10. The surface acoustic wave device according to claim 1, further comprising a second dielectric film covering the IDT electrode and a third dielectric film covering the second dielectric film.

11. The surface acoustic wave device according to claim 1, wherein the IDT electrode includes an adhesive layer and a principal electrode layer.

12. The surface acoustic wave device according to claim 11, wherein the adhesive layer includes at least one of Ti or NiCr.

13. The surface acoustic wave device according to claim 11, wherein the principal electrode layer includes at least one of AlCu, Au, Cu, or Pt.

14. The surface acoustic wave device according to claim 1, wherein the IDT electrode includes at least one of Ti, Al, Cu, Pt, Au, Ag, Pd, Mo, or W or an alloy including at least one of Ti, Al, Cu, Pt, Au, Ag, Pd, Mo, or W.

* * * * *